United States Patent [19]

Soga et al.

[11] Patent Number: 4,970,575
[45] Date of Patent: Nov. 13, 1990

[54] SEMICONDUCTOR DEVICE

[75] Inventors: Tasao Soga; Hiroaki Hachino; Mamoru Sawahata; Fumio Nakano, all of Hitachi; Fumiyuki Kobayashi, Sagamihara; Seigou Yukutake, Hitachi, all of Japan

[73] Assignee: Hitachi, Ltd., Tokyo, Japan

[21] Appl. No.: 507,096

[22] Filed: Apr. 9, 1990

Related U.S. Application Data

[63] Continuation of Ser. No. 816,295, Jan. 6, 1986, abandoned.

[30] Foreign Application Priority Data

Jan. 7, 1985 [JP] Japan .................................. 60-204

[51] Int. Cl.$^5$ ..................... H01L 23/30; H01L 23/28; H01L 23/14
[52] U.S. Cl. ......................................... 357/72; 357/80
[58] Field of Search ..................... 357/72, 67, 73, 80

[56] References Cited

U.S. PATENT DOCUMENTS 3,818,279  6/1974  Seeger, Jr. et al. .................. 357/72
4,190,855  2/1980  Inoue ..................................... 357/72
4,604,644  8/1986  Beckham et al. ..................... 357/67

Primary Examiner—Rolf Hille
Assistant Examiner—S. V. Clark
Attorney, Agent, or Firm—Antonelli, Terry, Stout & Kraus

[57] ABSTRACT

A substrate and semiconductor chips are connected by solder bumps and a vacant space around the solder bumps is coated with resin in such a degree that the tops of the semiconductor chips are not coated therewith. Epoxy resin or a resin having a smaller thermal expansion coefficient than the epoxy resin is used in the resin coating, and an inorganic material having a smaller thermal expansion coefficient than said resin is mixed therein.

11 Claims, 8 Drawing Sheets

SEMICONDUCTOR DEVICE

This application is a continuation of application Ser. No. 06/816,295, filed Jan. 6, 1986, now abandoned.

FIELD OF THE INVENTION

The present invention relates to a semiconductor resin package.

BACKGROUND OF THE INVENTION

A semiconductor device manufactured by a method wherein, when the opposite electrode terminals of a substrate and a semiconductor chip mounted on the substrate are connected by solder bumps and a vacant space around said solder bumps is coated with resin, the resin fills up space around the semiconductor chip, so that it is substantially equal in height to the top surface of the semiconductor chip and has a flat surface, is known publicly.

This semiconductor device is disclosed, for instance, in Japanese Pat. Laid-Open No. 107,641/1983 titled "Sealing Method of Semiconductor Device", which was laid open on June 27, 1983.

When a large silicon chip having a side of 8 to 10 mm is fitted on an $Al_2O_3$ substrate, in a prior-art semiconductor chip, the difference between the thermal expansion coefficient ($\alpha=2.7\times10^{-6}$/°C.) of Si and the coefficient of thermal expansion ($\alpha=6.8\times10^{-6}$/°C.) of $Al_2O_3$ and the distance between bumps located in the outermost peripheries determine the thermal fatigue service life of solder bumps in a package. A service life of fifteen years is demanded in terms of the distance between the bumps located in the outermost peripheries under severe conditions. A multilayer substrate having a coefficient of thermal expansion of $\alpha=4\times10^{-6}$/°C. is required to ensure a service life of fifteen years for an Si chip having a side of 8 to 10 mm, for instance, in order to meet the strong demand for a large, multi-terminal chip. Accordingly, when the $Al_2O_3$ substrate is used, it is thought impossible to form solder bumps on the whole surface of the large-sized chip having a side of 8 to 10 mm.

The prior-art semiconductor device has only a thermal fatigue resistance of the same level as a module structure in which bare chips are mounted.

SUMMARY OF THE INVENTION

An object of the present invention is to furnish a semiconductor device having greater thermal fatigue resistance than the module sturcutre in which bare chips are mounted.

In order to achieve the above-stated object, in the present invention, either an epoxy resin or a resin having a lower coefficient of thermal expansion than the epoxy resin is used, an inorganic material having a still smaller thermal expansion coefficient than said resin is mixed in the resin, and a vacant space around solder bumps is filled up with the mixture thus prepared.

According to the present invention, the thermal expansion coefficient of the resin approximates that of the solder bumps, and thermal stress caused by the difference in the coefficient of thermal expansion between a chip and a substrate is received by the entire resin having a large expansion rigidity. Therefore, destruction due to local strains of solder bumps located in the outermost peripheries, which is seen in the prior-art device, is eliminated, and the deformation of the solder due to the deformation of the resin causes no substantial burden, because of the absence of constraints.

BRIEF DESCRIPTION OF THE DRAWINGS

FIG. 1 shows an embodiment of a semiconductor resin package of the present invention, of which

DETAILED DESCRIPTION OF THE PREFERRED EMBODIMENTS

Figure 1A:
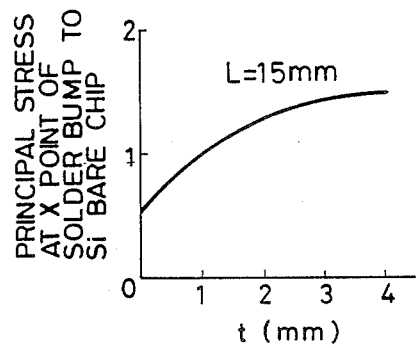
FIG 1A and FIG. 1B are characteristic diagrams for exemplifying the effect of the thickness of a resin coat, FIG. 1C a sectional view of a model of the package, and FIG. 1D a fragmentary enlarged view of the model of FIG. 1C.
Figure 1B:
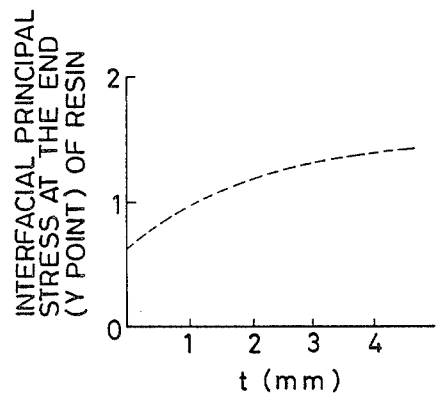

The present invention will be described hereunder based on embodiments thereof. First a description will be made of coating resin materials employed for the present invention. The thermal expansion coefficient $\alpha$ of an epoxy resin is about $100\times10^{-6}$/°C., which is larger than the thermal expansion coefficient $\alpha_{Si}=2.7\times10^{-6}$/°C. of a semiconductor chip, e.g. an Si chip, and the thermal expansion coefficient $\alpha_{PB}=12.5\times10^{-6}$/°C. in the direction of fibers of an organic multi-layer plate, e.g. a glass epoxy substrate. In order to improve thermal fatigue resistance, it is desirable, in general, to employ a coating resin having a thermal expansion coefficient approximate to that of a semiconductor chip or a substrate.

For this purpose, an inorganic material having a small thermal expansion coefficient, such as silica powder, is mixed in an epoxy resin or a polyimide resin having a smaller thermal expansion coefficient than the epoxy resin, so as to lower the degree of expansion. When silica powder of 50% in volume is mixed in for instance, the thermal expansion coefficient $\alpha$ lowers to about $25\times10^{-6}$/°C. this value is equal to the value of the thermal expansion coefficient of the solder itself and therefore the deformation of the solder is in accord with that of the resin having a large expansion rigidity. Thus, the concentration of stress of solder bumps located in the outermost peripheries is expected to be eliminated. With an increase in the mixing rate of the silica powder, however, the viscosity of the resin increases, and when the fluidity thereof lowers consequently, it becomes difficult for the resin to flow into the vacant space formed around solder bumps in a coating process. This causes such problems that vacant portions are left, that the adhesiveness to the substrate is reduced, that the operability of coating is decreased, etc. These problems are sometimes accompanied by contradictory results that resistance to thermal fatigue and resistance to humidity are reduced. When vacancies as large as bubbles are left in the vicinity of the solder bumps, for instance, the concentration of stress is intensified in the vicinity of the vacancies. A thermal cycle test revealed that the thermal fatigue service life of a sample having these vacancies was significantly shorter than that of a sample completely filled with the resin. In a humidity resistance test performed by means of a high-temperature protracted test, in which lifetimes were compared with means of a continuity check, it was also revealed that the humidity resistance of the former sample was apparently lower than the latter.

According to the experiments made by the present inventors, it was confirmed that the thermal fatigue resistance was improved when the mixing rate of silica powder was set at 30% to 60% by volume.

Moreover, if the mixing rate is made high, the flexibility of the resin is reduced, and consequently, stress is concentrated on the bonded part of the Si chip to the substrate. This stress is to cause damages to the substrate and the Si chip. Therefore, the thermal fatigue resistance can not be improved sufficiently only by mixing an expansion-reducing material for lowering the degree of expansion, and thus it is necessary to improve the fluidity and flexibility of the resin.

In this regard, the present invention aims to improve the flexibility and the fluidity by a method wherein a spherical-particulate elastic material, such as rubber particles of polybutadiene, polyisoprene silicone or the like, for instance, is mixed in dispersion in the resin in addition to the expansion-reducing material. Since the rubber particles in a coating resin act as a stress-absorbing material, the flexibility is thereby improved, and thus the concentration of stress and also strains are relaxed. The present invention aims to thereby improve the thermal fatigue resistance, and also to improve the fluidity by the action of the rubber particles.

The mixing rate of the rubber particles also has its optimum range, as will be described below. In the case when rubber particles of polybutadiene whose particle size is at a 1 $\mu$m level is mixed, for instance, the dispersion of the rubber particles becomes non-uniform and the thermal expansion coefficient $\alpha$ of polybutadiene becomes as great as $80 \times 10^{-6}/°C$. if the weight ratio of the rubber particles to the epoxy resin is set at 100:20 or above (this ratio is called a weight part or a part below and an expression is made as 20 part or above, for instance). Consequently, the thermal expansion coefficient $\alpha$ of the coating resin after said particles are mixed therein becomes large, thus causing the lowering of the thermal fatigue resistance. As for the effect of an improvement in the fluidity, a large improvement can not be expected as well because of a phenomenon of saturation.

These matters will be described on the basis of the results of experiments made by using an embodiment.

Table 1 shows the results of determination obtained by the same thermal cycle tests as described above, in which epoxy resin is used as a main material silica powder of particle size about 1 $\mu$m as the expansion-reducing material, uniform rubber particles of polybutadiene of particle size about 1 $\mu$m as the stress-absorbing material, and semiconductor devices coated with various resins containing the aforesaid materials in different mixing rates, respectively, as samples. The results of determination are shown in such a manner that samples becoming faulty in an earlier cycle than a device with bare chips coated with no resin are rated as failures and indicated by a symbol X while samples succeeding in the tests are indicated by symbols o and Δ, in a superiority sequence, with a fault rate used as a basis. The testing condition is a thermal cycle of $-55°$ to $150°$ C. and 1 ∞/h. As for a coating resin, imidazole (2P4MHz) 5 wt. % used as a curing accelerator, dicyanamide 10 wt. % used as a curing agent, a silane coupling agent (A-187) 2 wt. %, etc., for instance, are mixed therein as additives for lowering a curing temperature, and the curing temperature and a curing time are set at $130°$ C. and 1 hour, respectively.

The effect of mixing of the expansion-reducing material and the stress-absorbing material will be considered on the basis of the results of determination shown in Table 1. First, all of the samples in which the mixing rate of polybutadiene is zero, i.e. in which silica powder alone is mixed, show the results inferior to that of the device with bare chips. It was confirmed by experiments that the thermal fatigue lifetime increases with an increase in the mixing rate of the silica powder, when the samples coated with resin are compared quantitatively with one another. The limit of the mixing rate of

TABLE 1

| | Mixing rate (weight part) of polybutadiene to epoxy resin 100 weight part | | | | | | |
|---|---|---|---|---|---|---|---|
| | 0 | 1 | 5 | 10 | 15 | 20 | 25 |
| Mixing rate of silica powder (volume %) 0 | x | x | x | x | x | x | x |
| 20 | x | x | x | Δ | Δ | x | x |
| 30 | x | x | Δ | Δ | Δ | x | x |
| 35 | x | Δ | o | o | Δ | x | x |
| 40 | x | Δ | o | o | Δ | Δ | x |
| 50 | x | Δ | o | o | Δ | Δ | x |
| 55 | x | Δ | o | o | Δ | Δ | x |
| 60 | x | x | o | o | Δ | Δ | x |
| 65 | x | x | Δ | Δ | x | x | x | silica powder is 60% to 65% by volume, because the fluidity is reduced by the mixing of the silica powder and this causes the deterioration of the intrusion of the resin around solder bumps and under an Si chip.

As for polybutadiene, on the other hand, the fault rate is sharply lowered by mixing only a small quantity of it in the resin, and thus its remarkable effect as the stress-absorbing and fluidizing material is demonstrated. Consequently, a characteristic superior to that of a bare chip can be obtained in respect to thermal fatigue resistance. When the mixing rate of polybutadiene is made high, however, the dispersion thereof turns out to be non-uniform as stated previously, thus the thermal fatigue resistance being reduced. Based on these results and the results shown in Table 1, it is concluded that the thermal fatigue resistance superior to that of a bare chip can be obtained by setting the mixing rate of silica powder in the range of 30% to 60% by volume and the mixing rate of polybutadiene rubber particles in the range of 1 to 20 parts. For instance, the thermal fatigue resistance, service life, of a device with silica powder 50% by volume and 5 parts polybutadiene mixed therein is three or more times larger than that of the bare chip, so that the reliability is improved sharply. As for the expansion-reducing material, an inorganic material having a small thermal expansion coefficient, such as calcium carbonate, silicon carbide having high thermal conductivity, silicon nitride having the same property, or silicon carbide with beryllium oxide mixed therein, can be used other than silica, and the same effect can be obtained from any one of these materials. The particle size of this expansion-reducing material is not limited to 1 μm of the above-described embodiment, and an excellent result can be obtained when the size is within 1 to 40 μm.

As for the elastic material, rubber particles having great elasticity, such as silicone rubber particles, can be used other than the polybutadiene rubber particles. Moreover, the particle size thereof is not limited to 1 μm, and an excellent result can be obtained within a range of 0.1 to 5 μm. By mixing carbon black of about 1% to 2% in the resin, it can be colored black with no effect on the reliability. Long employment of a resin causes the deterioration and discoloration of the surface thereof, which makes a user feel uneasy although the characteristics are not varied. Therefore, by coloring the resin black, brown or red (obtained by mixing red oxide), the discoloration due to the deterioration can be made inconspicuous, which brings forth an advantage that the user can use the device without uneasiness.

Next, a description will be made on the shape of a resin coat. Even when the expansion-reducing material such as silica powder is mixed in, as described above, the thermal expansion coefficient α of the epoxy resin is still a larger value than those of the substrate and the Si chip, and the Si chip, solder bumps, the substrate, or the connecting parts of these members, are damaged by a stress caused by the difference between the members. Experiments revealed that the connecting part of the solder bumps with the Si chip was the weakest of all to a repeated stress.

Based on this fact, the shape of a resin coat capable of reducing the stress generated in said connecting part, i.e. the thickness of a coat on the top surface of the Si chip and the width of a coat around the Si chip, were found by a finite element method. Concretely, the maximum stress (tensile stress relating to damage) applied on the connecting part of the solder bumps with the Si chip when the thickness of the coat on the top surface of the si chip was represented by t mm, as shown in FIG. 1C, was found. It is shown as a ratio to the maximum tensile stress in a bare chip in FIG. 1A. As is shown in FIGS. 2B and 2C, the maximum stress was found in the direction of arrows in these figures by using a substrate and an Si chip of 6-mm square, a partially-broken-sphere-shaped solder bump 100 μm high, 150 μm wide, etc., and a resin coat model whose entire width 2(l=a) was fixed at 15-mm square, for instance. The stress applied at the position of a point Y of the arrow turns to be tensile stress when the temperature changes from room temperature to 100° C., while it turns to be a compressive stress when the temperature changes from the room temperature to −40° C.

Figure 1C:
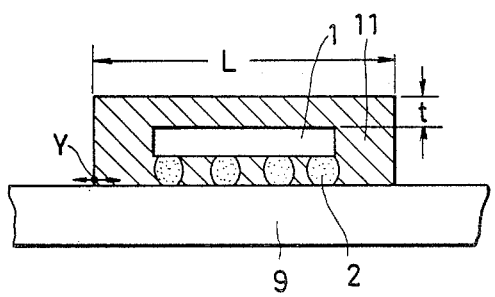
Figure 1D:
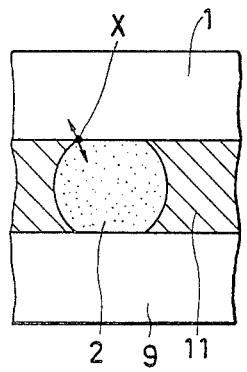

As is seen from FIG. 1A, the maximum tensile stress applied on the connecting part, a point X, of an Si chip 1 with a solder bump 2 increases with an increase in the thickness t of a coat of resin 11. It can be concluded, accordingly, that the smaller thickness t of the coat is the better. Based on this conclusion, examinations were made on the effect of a change in the width of the resin coat in the case when the thickness t of the resin coat on the top surface of the chip was equal to 0.

Figure 2A:
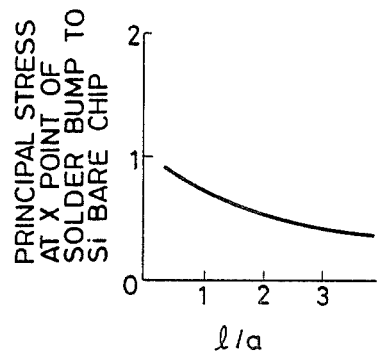
FIG. 2A and FIG. 2B are characteristic diagrams for exemplifying the effect of the width of the resin coat shown in FIG. 1, FIG. 2C a sectional view of a model, and FIG. 2D a fragmentary enlarged view of the model of FIG. 2C.
Figure 2B:
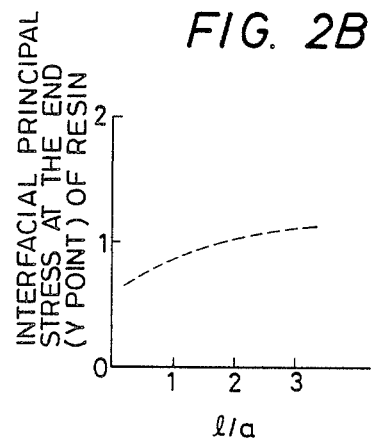
Figure 2C:
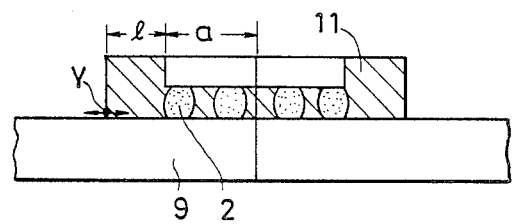
Figure 2D:
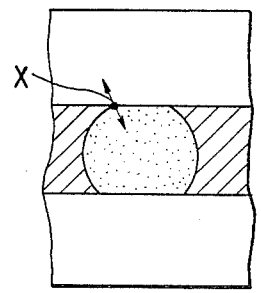

FIG. 2A shows the relationship between the width of the resin coat formed around the Si chip and the maximum stress applied on the aforesaid connecting part. As shown in this figure, the maximum tensile stress tends to decrease as l/a increases. This tendency has been confirmed by a calculation according to the finite element method.

Therefore, the maximum tensile stress can be reduced by increasing l/a. In other words, the thermal fatigue resistance of the given chip can be improved in comparison with that of a bare chip by making the shape of the coat appropriate even when the thermal expansion coefficient of the coating resin is large. However, the bonded part of the resin coat to the substrate and the resin itself tend to be damaged as l/a is increased, although the maximum tensile stress on the solder is reduced effectively, and in addition, consideration must be given to packaging of high density. Therefore, the range of 0.3 to 1.0 is regarded as appropriate for l/a.

Figure 3A:
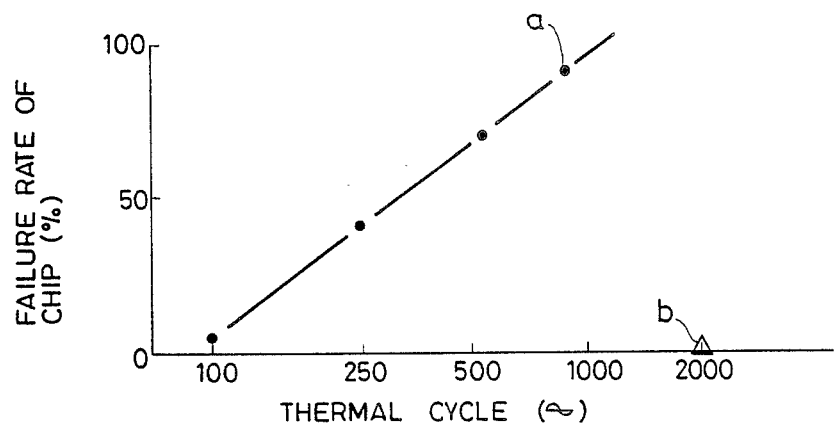
FIG. 3A exemplifies the effect of the structure of the resin coat of FIG. 1 revealed by a thermal cycle test, FIG. 3B exemplifies the structure at a point a of FIG. 3A, and FIG. 3C exemplifies the structure at a point b of FIG. 3A.
Figure 3B:
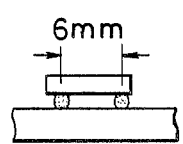
Figure 3C:
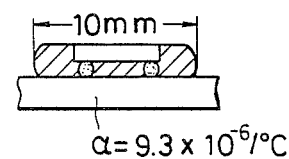

The foregoing is a description of the embodiments to which the coating resin materials and coating shapes of the present invention are applied separately. It is a matter of course that the thermal fatigue resistance of the device can be improved further by combining these embodiments with one another. The highly-reliable structure disclosed by the present invention is premised on the assumption that both the materials of the coat and the shapes thereof are within the respective appropriate spheres, and if either one of these premises is lacking, the lifetime is shortened. Epoxy resin in which silica powder of mixing rate 50 volume % and polybutadiene of mixing rate 5 wt. % were mixed as shown in Table 1 was applied on a substrate of $=9.3 \times 10^{-6}/°C.$ having the structure of FIG. 3C, and cured, and the epoxy resin thus prepared was subjected to a thermal cycle test ($-55°$ to $150°$ C., $1\infty/h$). While the service life of the bare chip shown in FIG. 3B was 300 ∞ (chip fault rate: 50%), no disconnection took place in the structure coated with the resin even after 2000 ∞ passed.

Figure 4A:
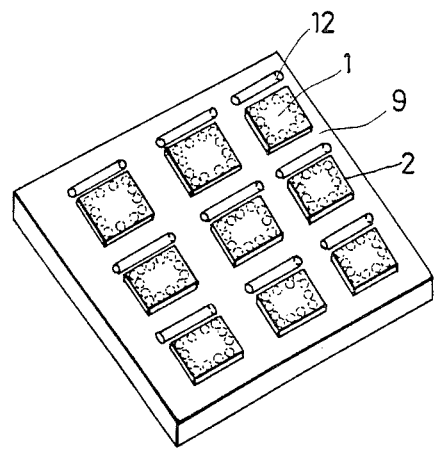
FIG. 4A is a perspective view of an embodiment of a resin-coated package of a multimodule structure to which the present invention is applied.

FIG. 4A shows one example of a method of coating a multichip structure with resin. First, Si chip terminals are positioned at terminals on a multilayer substrate (not shown in the figure) and subjected to reflow soldering. The multilayer substrate 9 thus prepared is inclined and fixed, and cylindrical compounded resin pieces 12 shown in FIG. 4A are put on the substrate and left for 10 minutes at 125° C. Then the spaces between the chips and the multilayer substrate are buried with the resin. Thereafter the multilayer substrate is laid horizontally, a prescribed amount of resin is put on each chip, a pressure 13 is applied thereon by using a jig shown in FIG. 4B, and the resin is cured. The resin on the chip is extruded to the surrounding space and thus barely left on the chip. Therefore there is little possibility of increasing thermal resistance. At this time, adjacent chips must not be bound on one another. The application of the resin can be conducted by a method in which the place other than the tops of the chips is all coated with the resin as shown in FIG. 5 and thereafter the chips are cut away from one another by using a mechanical means or a heat source such as a laser. A groove 21 between adjacent chips can be formed also by using a die when the resin is cured.

Figure 6A:
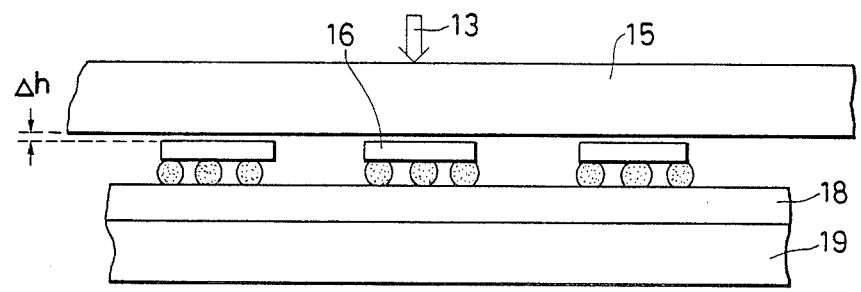
FIG. 6A is a sectional view showing a process applied to the case when the heights of chips shown in FIG. 5 are not uniform.
Figure 6B:
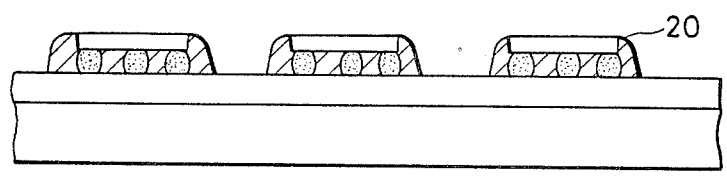
FIGS. 6B and 6C show sections formed after the chips of FIG. 6A are coated with resin, respectively.
Figure 6C:
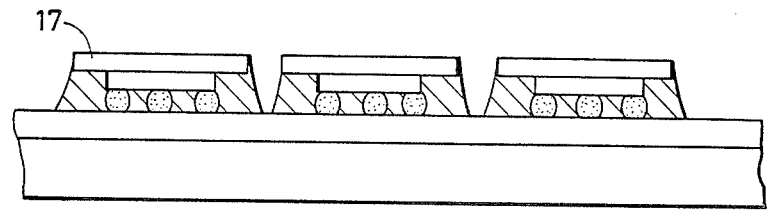

FIG. 6 shows a process of forming a pressure-bonded structure, in which pressure can be applied uniformly on each chip through one water cooling plate 17. To repair chips, a method is adopted in which all the chips are connected on a substrate (a multilayer printed board 18 and a ceramic substrate, or the multilayer printed board alone) and then the electrical characteristics thereof as modules are rated to detect defective chips and replace them with non-defective chips. If no defective chip is found in this stage, the probability of chips turning defective in a subsequent process is very small. Therefore the remaining problem is the thermal fatigue service life of the connecting parts of chips, and in this point, the high reliability of the resin-coated chips is significant. When there is no problem in the electrical characteristics, a pressure 13 is applied onto the tops of the chips in an ambient of 150° C. by using a flat board 15 as shown in FIG. 6A. Thereby the solder bumps of a chip 16 having a large height are made to creep, and reflow soldering is effected, so that the height of all the chips is made equal.

Figure 4B:
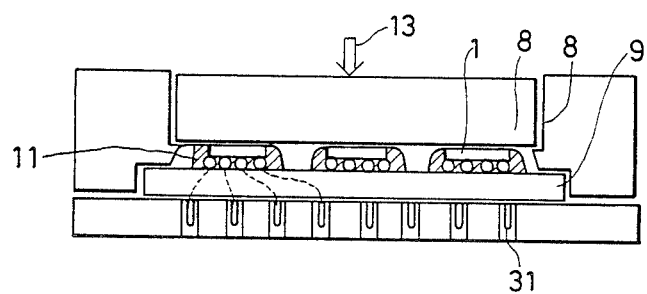
FIG. 4B is a sectional view of the embodiment of FIG. 4A.
Figure 5A:
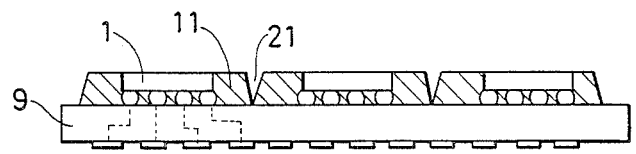
FIG. 5A is a sectional view of a multichip module structure in the embodiment of the package to which the present invention is applied.
Figure 5B:
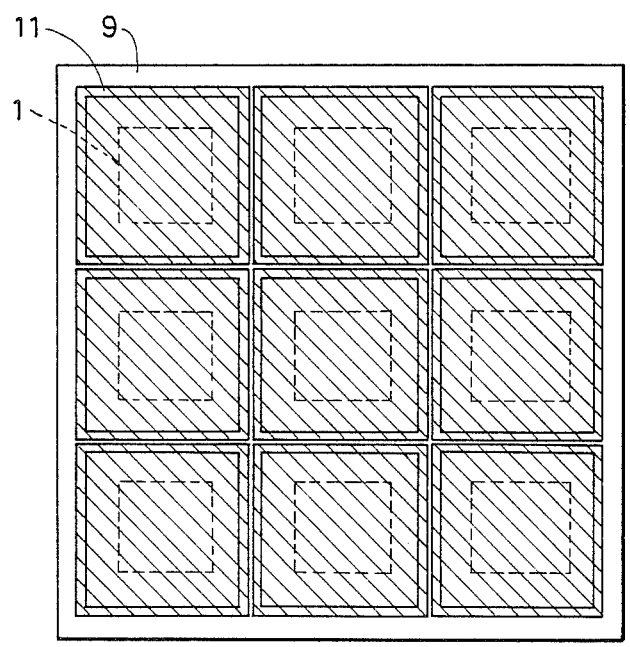
FIG. 5B is a plan view of the structure of FIG. 5A.

Next, resin is applied to form a structure of FIG. 4B or FIG. 4C by using a method shown in FIG. 4. SiC, Cu, Cu-C composite, Al or the like, each of which has a high thermal conductivity, is suitable for a heat sink 17 of the structure of FIG. 4C. When insulation properties are required, an Si spatter film is applied advisably on the metallic surface of the heat sink material 17. A chip 1 and the heat sink 17 are connected by either of two means: (1) solder and (2) as not to increase the thermal resistance. The advantage of the structure of FIG. 4C is that a heat-radiating plate of high thermal conductivity thus bonded has the effect of releasing heat in a smooth and stable manner.

Figure 7A:
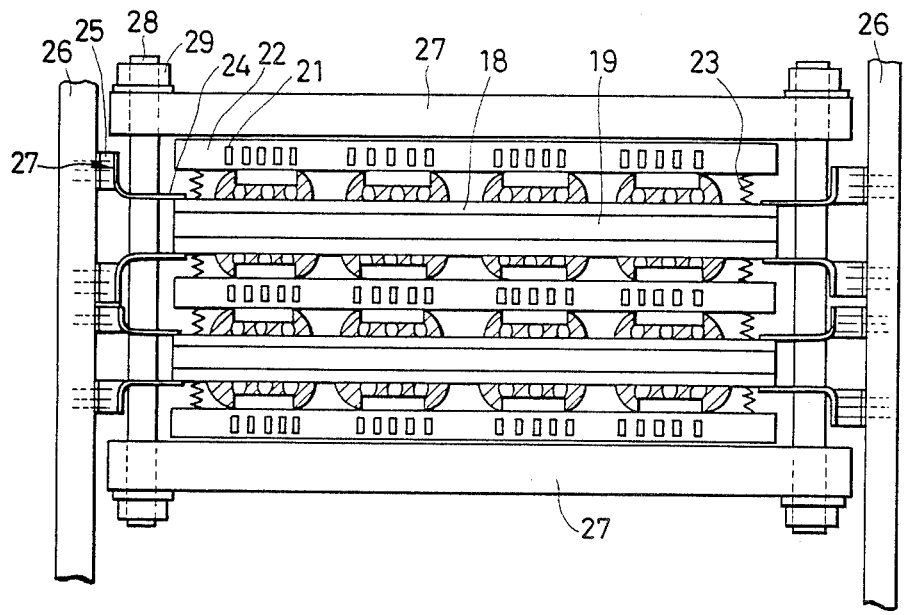
FIGS. 7A and 7B exemplify sectional models of a multi-stage structure of the multichip module shown in FIG. 5, respectively.
Figure 7B:
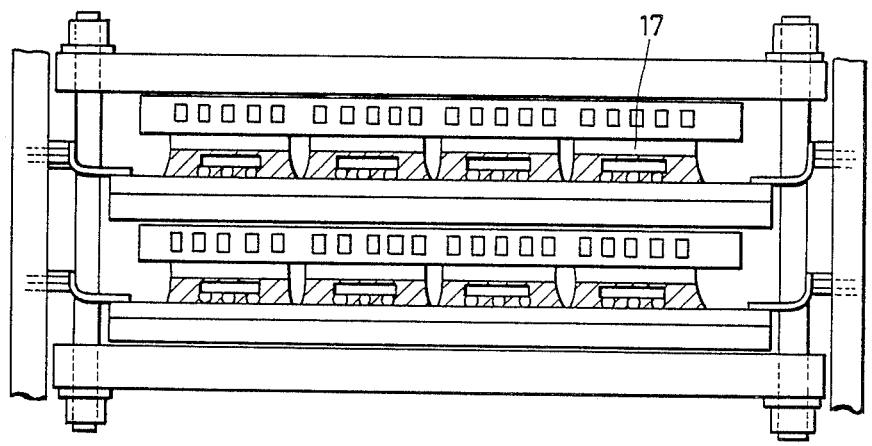

FIG. 7 shows sectional models of pressure-bonded watercooled structures, which are illustrated in FIG. 7A and FIG. 7B. A cooling element has a structure in which flowing water channels 21 are formed along chip lines, and Cu, SiC, Al or the like, which is excellent in thermal conductivity, is suitable for this structure. These modules are constructed so that the whole of them are enveloped in an inactive ambient, and therefore a structure of bellows pressure contact 23 is employed for the peripheral wall of a multilayer plate 18 and a heat sink plate 22. Accordingly, thermal stress caused by the difference in the thermal expansion coefficient between a substrate 19 and the heat sink 22 hardly affects the service life of the chips.

Input/output terminals 24, which are flexible tapes, are provided on the periphery of the substrate and connected, by connectors 27, to pins 25 of multilayer printed boards 26 which are set vertically. FIG. 7A shows a packaging example in which resin-coated chips are provided on both surfaces of the substrate, while FIG. 7B shows a packaging example in which chips and heat sinks 17 both coated with resin are provided on one surface of the substrate. Both the structures of FIGS. 7A and 7B are constructed according to a system in which flat plates 27 having a flexural rigidity are bonded with a strong pressure by means of bolts 28 and nuts 29. Since the epoxy resin occupies a large area and is hard, there is no fear of deformation even when the strong pressure is applied. The structures thus formed have excellent cooling properties enabling the uniform radiation of as much heat as that of a 20 to 50 W level per chip.

Figure 8:
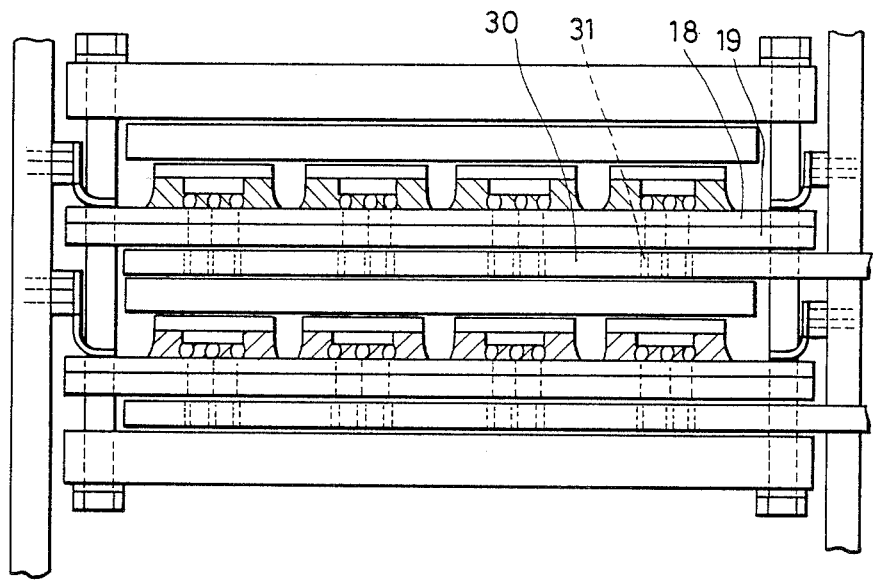
FIG. 8 exemplifies a sectional model of a multi-stage structure in which feeder plates are put in the multimodule shown in FIG. 5.

FIG. 8 shows a structure in which a feeder plate 30 is provided for high-output chips. The feeder plate is formed of a multilayer printed board and connected according to temperature gradient with a low-melting solder by using pins 31 connected to a multilayer plate 18. The thermal expansion coefficient of the multilayer plate 18 is about $10 \times 10^{-6}$ and thus this plate is sufficiently reliable. Therefore, it is not necessary to stick the plate with a ceramic substrate 19 (SiC, mullite, $Al_2O_3$ or the like). A multiplate of such resin as glass epoxy, glass polyimide, or glass isomelamine, for instance, may be used. Alamid cloth may be used also instead of glass cloth.

The present invention furnishes structures which have superior thermal fatigue resistance to the prior-art $Al_2O_3$ substrate even when an organic multilayer plate having a relatively large thermal expansion coefficient is used, and whose thermal resistance is so low as to make a pressure bonded structure possible, thus making a low-cost packaging possible. The structures furnished by the present invention are excellent also in their resistance to shock and vibration occurring in the course of transportation and operation.

What we claim is:

1. A semiconductor device comprising at least one semiconductor chip having an integrated circuit on one surface thereof, a substrate with said at least one semiconductor chip mounted thereon, solder bumps electrode terminals of said substrate and said semiconductor which connect electrically a circuit formed on the surface of the substrate and a circuit of said at least one semiconductor chip and a cured resin filling up at least a space around said solder bumps which is formed between said at least one chip and the substrate, wherein said cured resin comprises a composite of (a) a thermosetting resin, (b) a first powdery-particulate body formed of an inorganic material having a smaller thermal expansion coefficient than that of the thermosetting resin and (c) a second powdery-particular body of a rubber state elastic material, and a thermal expansion coefficient of said composite is approximately equal to that of the solder.

2. A semiconductor device comprising at least one semiconductor chip having integrated circuit on one surface thereof, a substrate with said at least one semiconductor chip mounted thereon, solder bumps which connect electrically the circuit formed on the surface of the substrate and a circuit of said at least one semiconductor chip and a cured resin filled up at least a space around said solder bumps which is formed between said at least one semiconductor chip and the substrate, wherein said cured resin comprises a composite of (a) a thermosetting resin, (b) a first powder-particulate body formed of an inorganic material having a smaller thermal expansion coefficient than that of the thermosetting resin and a particle size of 1 to 40 μm and (c) a second powdery-particulate body of a rubber state elastic material having a particle size of 0.1 to 5 μm, the mixing rate of the aforesaid first powdery-particulate body is characterized by being 30 to 60 volume %, and the mixing rate of the aforesaid second powdery-particulate body is characterized by being 1 to 20 by parts weight.

3. A semiconductor device according to claim 1, wherein said thermosetting resin is formed of epoxy resin, said first powdery-particulate body is formed at least one of silicon, calcium carbonate, silicon carbide or silicon carbide with beryllium oxide mixed therein, and said second powdery-particulate body is formed at least one of polybutadiene, or silicon rubber.

4. A semiconductor device according to claim 1, wherein said composite covers a periphery and an upper surface of said semiconductor chip.

5. A semiconductor device according to claim 1, wherein said composite covers a periphery except an upper surface of said semiconductor chip.

6. A semiconductor device comprising at least one semiconductor chip having an integrated circuit on one surface thereof, a substrate with said at least one semiconductor chip mounted thereon, solder bumps which connect electrically the circuit formed on the surface of the substrate and a circuit of said at least one semiconductor chip and a cured resin filling up at least a space around said solder bumps which is formed between said at least one semiconductor chip and the substrate, wherein said cured resin comprises a composite of (a) a thermosetting resin, (b) a first powdery-particulate body formed of an inorganic material having a smaller thermal expansion coefficient than that of the thermosetting resin, (c) a second powdery-particulate body of a rubber state elastic material, (d) a hardening accelerator, (e) a curing agent and (f) a silane coupling agent, and a thermal expansion coefficient of said composite is approximately equal to that of the solder.

7. A semiconductor device according to claim 1, wherein a width of said composite formed around said semiconductor chip contacting on an upper surface of said substrate in more than 0.6 to less than 2.0 of a width of said chip.

8. A semiconductor device comprising at least one semicondcutor chip having an integrated circuit on one surface thereof, a substrate with said at least one semiconductor chip mounted thereon, solder bumps which connect electrically to the circuit formed on the surface of the substrate and a circuit of said at least one semiconductor chip and a cured resin filling up at least a space around said solder bumps which is formed between said at least one semiconductor chip and the substrate, wherein said cured resin comprises a composite of (a) a thermosetting resin, (b) an inorganic filler in an amount sufficient to substantially lower the thermal expansion coefficient of the thermosetting resin, and a thermal expansion coefficient of said composite is approximately equal to that of the solder.

9. A semiconductor device comprising at least one semiconductor chip having an integrated circuit on one surface thereof, a substrate with said at least one semiconductor chip mounted thereon, solder bumps which connect electrically the circuit formed on the surface of the substrate and a circuit of said at least one semicondcutor chip and a cured resin filling up at least a space around of solder bumps which is formed between said at least one semiconductor chip and the substrate, wherein said substrate is formed of a multilayer printed board, a number of semiconductor chips are mounted on said multilayer printed board, said cured resin comprises a composite of (a) a thermosetting resin, (b) an inorganic filler in an amount sufficient to substantially reduce a thermal expansion coefficient of the thermosetting resin and (c) an organic rubber filler in an amount sufficient to substantially lower the thermal expansion coefficient of the thermosetting resin, and a thermal expansion coefficient of said composite is approximately equal to the solder.

10. A semiconductor device comprising at least one semiconductor chip having an integrated circuit on one surface thereof, a substrate with said at least one semiconductor chip mounted thereon, solder bumps which connect electrically the circuit formed on the surface of the substrate and circuit of said at least one semiconductor chip and a cured resin filling up at least a space around said solder bumps which is formed between said at least one semiconductor chip and the substrate, wherein a heat-radiating block contacts to a surface of said at least one semiconductor chip at an opposite surface thereof in which the circuit of said at least one semiconductor chip is mounted for releasing heat of said at least one semiconductor chip, said cured resin comprises a composite of (a) a thermosetting resin, (b) an inorganic filler in an amount sufficient to substantially reduce a thermal expansion coefficient of the thermosetting resin and (c) an organic ribber filler in an amount sufficient to substantially lower the thermal expansion coefficient of the thermosetting resin, and a thermal expansion coefficient of said composite is approximately equal to the solder.

11. A semiconductor device comprising at least one semiconductor chip having an integrated circuit on one surface thereof, sa substrate with said at least one semiconductor chip mounted thereon, a solder bumps which connect electrically the circuit formed on the surface of the substrate and a circuit of said at least one semiconductor chip and a cured resin filling up at least a space around said solder bumps which is formed between said at least one semiconductor chip and the substrate, wherein a heat sink contacts to a surface of said at least one semiconductor chip at an opposite surface thereof in which the circuit of said at least one semiconductor chip is mounted for releasing heat of said at least one semiconductor chip, said cured resin comprises a composite of (a) a thermosetting resin, (b) an inorganic filler in an amount sufficient to substantially reduce a thermal expansion coefficient of the thermosetting resin and (c) an organic rubber filler in an amount sufficient to substantially lower the thermal expansion coefficient of the thermosetting resin, and a thermal expansion coefficient of said composite is approximately equal to the solder.

* * * * *

UNITED STATES PATENT AND TRADEMARK OFFICE
CERTIFICATE OF CORRECTION

PATENT NO. : 4,970,575
DATED : November 13, 1990
INVENTOR(S) : SOGA et al

It is certified that error appears in the above-identified patent and that said Letters Patent is hereby corrected as shown below:

Column 8, line 67, (claim 3, line 4), delete "silicon"
    and insert --silica--.

Column 8, line 67, (claim 3, line 4), after "silicon carbide"
    insert --, silicon nitride--.

Column 9, line 30, (claim 7, line 4), delete "0.6 to less than
    2.0 of" and insert --0.3 to 1.0 of half--.

Signed and Sealed this

Seventeenth Day of November, 1992

Attest:

DOUGLAS B. COMER

Attesting Officer

Acting Commissioner of Patents and Trademarks